United States Patent
Yang et al.

(10) Patent No.: US 11,996,494 B2
(45) Date of Patent: May 28, 2024

(54) LOW-COST PASSIVATED CONTACT FULL-BACK ELECTRODE SOLAR CELL AND PREPARATION METHOD THEREOF

(71) Applicant: JIANGSU RUNERGY CENTURY PHOTOVOLTAIC TECHNOLOGY CO., LTD., Yancheng (CN)

(72) Inventors: Yang Yang, Yancheng (CN); Rulong Chen, Yancheng (CN); Yanbin Zhu, Yancheng (CN); Haibo Li, Yancheng (CN); Zhuojian Yang, Yancheng (CN); Longzhong Tao, Yancheng (CN)

(73) Assignee: JIANGSU RUNERGY CENTURY PHOTOVOLTAIC TECHNOLOGY CO., LTD., Yancheng (CN)

( * ) Notice: Subject to any disclaimer, the term of this patent is extended or adjusted under 35 U.S.C. 154(b) by 0 days.

(21) Appl. No.: 18/099,271

(22) Filed: Jan. 20, 2023

(65) Prior Publication Data
US 2023/0307573 A1    Sep. 28, 2023

Related U.S. Application Data

(63) Continuation of application No. PCT/CN2022/114411, filed on Aug. 24, 2022.

(30) Foreign Application Priority Data

Mar. 25, 2022    (CN) .......................... 202210305172.4

(51) Int. Cl.
*H01L 31/18*    (2006.01)
*H01L 31/0216*    (2014.01)
(Continued)

(52) U.S. Cl.
CPC ...... *H01L 31/182* (2013.01); *H01L 31/02168* (2013.01); *H01L 31/022441* (2013.01);
(Continued)

(58) Field of Classification Search
CPC ............. H01L 31/182; H01L 31/02168; H01L 31/022441; H01L 31/02363;
(Continued)

(56) References Cited

U.S. PATENT DOCUMENTS

2010/0084009 A1* 4/2010 Carlson ........... H01L 31/022441
                                                257/E31.124
2017/0236972 A1    8/2017 Chung et al.

FOREIGN PATENT DOCUMENTS

CN      109994570 A   *  7/2019   ....... H01L 31/02363
CN      109994570 A      7/2019
(Continued)

OTHER PUBLICATIONS

Shao et al., CN 113363354 A, English Machine Translation. (Year: 2021).*
(Continued)

*Primary Examiner* — Tae-Sik Kang
(74) *Attorney, Agent, or Firm* — Bayramoglu Law Offices LLC

(57) ABSTRACT

A preparation method of a low-cost passivated contact full-back electrode solar cell includes: performing alkali polishing on a Si wafer; performing RCA cleaning and HF cleaning; growing a tunnel $SiO_x$ film layer, an in-situ doped amorphous Si film layer, and a texturing mask layer on the back of the Si wafer; performing annealing activation on the amorphous Si film layer to form a polycrystalline Si film layer; etching the texturing mask layer; performing double-sided texturing on the Si wafer; performing HF cleaning to remove the texturing mask layer; depositing an $AlO_x$ film on the front and back of the Si wafer; depositing a $SiN_x$ passivation film on the front and back of the Si wafer; ablating a part of the $AlO_x$ film and a part of the $SiN_x$ passivation film on the back of the Si wafer; and performing screen-printing and sintering on the back of the Si wafer.

9 Claims, 1 Drawing Sheet

(51) Int. Cl.
  *H01L 31/0224* (2006.01)
  *H01L 31/0236* (2006.01)
  *H01L 31/0368* (2006.01)
  *H01L 31/068* (2012.01)

(52) U.S. Cl.
  CPC .. *H01L 31/02363* (2013.01); *H01L 31/03682* (2013.01); *H01L 31/0682* (2013.01); *H01L 31/1868* (2013.01); *H01L 31/1872* (2013.01)

(58) Field of Classification Search
  CPC ........... H01L 31/03682; H01L 31/0682; H01L 31/1868; H01L 31/1872
  See application file for complete search history.

(56) References Cited

FOREIGN PATENT DOCUMENTS

| | | | |
|---|---|---|---|
| CN | 110571149 A | | 12/2019 |
| CN | 113363354 A | * | 9/2021 |
| CN | 113363354 A | | 9/2021 |
| CN | 114678446 A | | 6/2022 |
| CN | 114792744 A | | 7/2022 |

OTHER PUBLICATIONS

Wan et al., CN 109994570 A, English Machine Translation. (Year: 2019).*

* cited by examiner

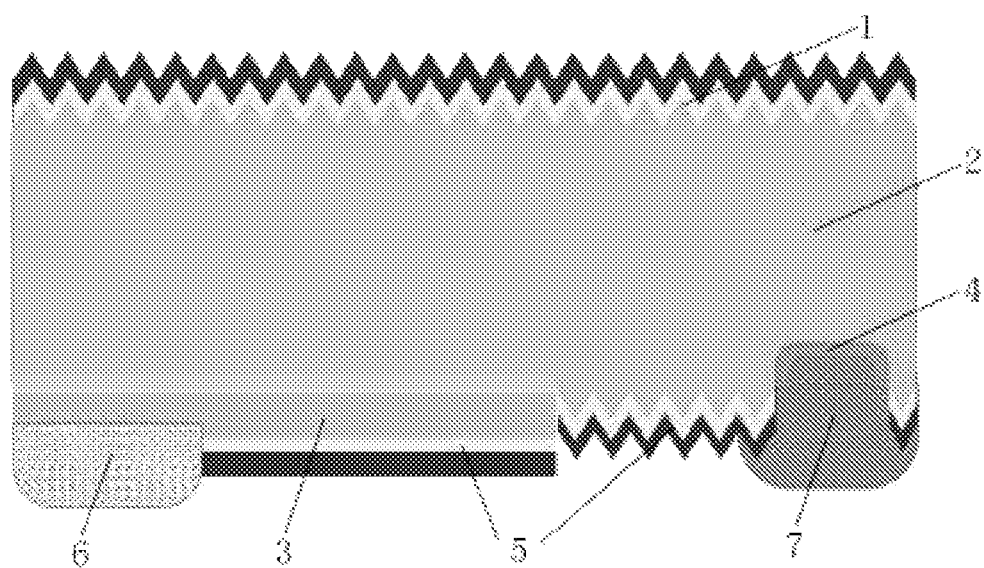

LOW-COST PASSIVATED CONTACT FULL-BACK ELECTRODE SOLAR CELL AND PREPARATION METHOD THEREOF

CROSS REFERENCE TO THE RELATED APPLICATIONS

This application is the continuation application of International Application No. PCT/CN2022/114411, filed on Aug. 24, 2022, which is based upon and claims priority to Chinese Patent Application No. 202210305172.4, filed on Mar. 25, 2022, the entire contents of which are incorporated herein by reference.

TECHNICAL FIELD

The present invention relates to the technical field of crystalline silicon (Si) solar cells, particularly to a low-cost passivated contact full-back electrode solar cell and a preparation method thereof.

BACKGROUND

The full-back electrode cell has the highest efficiency and the greatest potential among the crystalline Si solar cells at present, and the positive and negative electrodes of the full-back electrode cell are both located on the back of the cell. Compared with the conventional cell, the structural design of the full-back electrode cell eliminates the shading loss of the front grid line and also brings more space to the back of the cell. Tunnel oxide passivated contact (TOPCon) technology is considered to be the next generation of passivation technology with the most potential after the passivated emitter and rear cell (PERC) technology. The TOPCon technology takes advantage of the good metal area passivation effect of the tunnel oxide layer and the polycrystalline Si film layer and greatly reduces the recombination process under the metal grid line of the cell. In recent years, the integration of the full-back electrode and the TOPCon technology has become a research hotspot in the industry. Photovoltaic enterprises and scientific research institutions, such as SunPower Corporation in the United States, Fraunhofer ISE Institute in Germany, and ISFH Institute in Germany, have made good progress in mass production and laboratory production of the integration of the full-back electrode and the TOPCon Technology. The cell conversion efficiency is more than 25% in a large area and more than 26% in a small area, which shows promising prospects for industrial application.

However, the preparation of these full-back electrode cells described above has a complex process and a high cost, which requires large costs if upgrading is performed on the prior PERC production line. The photovoltaic industry continuously seeks efficiency improvement and cost reduction. In the case of the PERC cell efficiency gradually approaching the theoretical limit, it is highly desirable to develop a new type of cell technology that can be implemented by upgrading the prior PERC production line to extend the service cycle of the prior PERC device and reduce the manufacturing cost per watt of the cell of in the industry. In addition, with the continuous progress of P-type Si wafer materials, the minority carrier lifetime is increased, which can meet the technical requirements of the full-back cell structure.

SUMMARY

An objective of the present invention is to provide a preparation method for a passivated contact full-back electrode solar cell with good process compatibility and low cost, which can upgrade the new cell technology based on the prior PERC production line to extend the service life of the prior PERC device and reduce the manufacturing cost per watt of the cell of the entire industry.

The present invention is realized by the following technical solutions:

A preparation method for a low-cost passivated contact full-back electrode solar cell includes the following sequential steps:
- S1: configuring a P-type monocrystalline Si wafer as a Si substrate and performing an alkali polishing on the Si substrate;
- S2: after performing the alkali polishing, performing a Radio Cooperation of America (RCA) cleaning and a hydrogen fluoride (HF) cleaning for high cleanliness;
- S3: growing a tunnel silicon oxide (SiOx) film layer, an in-situ doped amorphous Si film layer, and a texturing mask layer on the back of the Si wafer;
- S4: performing an annealing activation on the amorphous Si film layer so that the amorphous Si film layer is transformed into a polycrystalline Si film layer;
- S5: etching the texturing mask layer on the back of the Si wafer by a laser;
- S6: performing a double-sided texturing on the Si wafer;
- S7: after performing the texturing, performing the HF cleaning to completely remove the texturing mask layer;
- S8: simultaneously depositing an aluminum oxide ($AlO_x$) film on the front and back of the Si wafer;
- S9: depositing a silicon nitride ($SiN_x$) passivation film or a silicon nitride/silicon oxynitride ($SiN_x/SiON_x$) laminated passivation film on the front and back of the Si wafer;
- S10: ablating, by the laser, a part of the $AlO_x$ film, and a part of the $SiN_x$ passivation film or the $SiN_x/SiON_x$ laminated passivation film on the back of the Si wafer; and
- S11: performing a screen-printing and a sintering on the back of the Si wafer, where a silver paste is used in a passivated contact area, and an aluminum paste is used in a backfield area.

Specifically, the preparation method of the low-cost P-type Si wafer passivated contact full-back electrode crystalline Si solar cell designed in the present invention uses the P-type monocrystalline Si wafer as the Si substrate. The polishing is first performed, and then the tunnel $SiO_x$ film layer, the doped amorphous Si film layer, and the texturing mask layer are grown on the back of the cell. The three film layers are deposited in the same device. After the annealing activation is performed on the amorphous Si film, the texturing mask layer of the P-type area on the back of the cell is ablated by a laser, and then the texturing is performed. The $AlO_x$ films are deposited on both sides, and then an antireflection passivation film is deposited on the front and back of the cell, respectively. A part of the $AlO_x$ film and a part of the antireflection passivation film on the backfield area on the back of the cell are ablated by the laser to form a local aluminum backfield, and finally, the electrode is printed and sintered.

The preparation method for the low-cost passivated contact full-back electrode solar cell design of the present invention makes full use of the characteristics of the single-sided coating and flexible growth of multiple types of films in a single cavity in plasma-enhanced chemical vapor deposition (PECVD). The passivated contact structural film layer and the mask film layer of the full-back electrode cell are completed in one process step, which can effectively reduce the process steps, reduce the consumption of silver paste, and improve cell efficiency.

Further, according to the preparation method for the low-cost passivated contact full-back electrode solar cell, in step S1, the P-type monocrystalline Si wafer is configured as the Si substrate, where the Si wafer has a resistivity of 0.5 ohm-cm to 5 ohm-cm and a thickness of 120 μm-200 μm. The alkali polishing is performed on the Si substrate by a 15 wt %-30 wt % potassium hydroxide (KOH) solution at 75° C.-85° C.

Further, according to the preparation method for the low-cost passivated contact full-back electrode solar cell, in step S3, a tubular or platelike PECVD device configured for single-sided deposition is configured to perform a three-in-one multi-layer film deposition on the back of the Si wafer to grow the tunnel $SiO_x$ film layer, the in-situ doped amorphous Si film layer, and the texturing mask layer. The thickness of the tunnel $SiO_x$ film layer is less than 2 nm, and the amorphous Si film layer is an in-situ phosphorus-doped film with a thickness of 50 nm-200 nm. The texturing mask layer is made of $SiON_x$, $SiO_x$, or $SiN_x$ with a thickness of 50 nm-100 nm.

Further, according to the preparation method for the low-cost passivated contact full-back electrode solar cell, in step S4, the annealing activation is performed on the amorphous Si film layer, so that the amorphous Si film layer is transformed into the polycrystalline Si film layer with a sheet resistance controlled at 50 ohm/sq-100 ohm/sq. Specifically, the annealing activation is performed by a tubular oxidation furnace. The process temperature is 700° C.-900° C., the time for the annealing activation is 1 h-2 h, and the doping concentration after activation is $1e^{18}$ $CM^{-3}$-$5e^{20}$ $cm^{-3}$.

Further, according to the preparation method for the low-cost passivated contact full-back electrode solar cell, in step S6, the double-sided texturing is performed on the Si wafer using a KOH or tetramethylammonium hydroxide (TMAH) solution to form a light-trapping textured structure.

Further, according to the preparation method for the low-cost passivated contact full-back electrode solar cell, in step S7, after performing the texturing, cleaning is performed by a 5 wt %-20 wt % HF solution to completely remove the deposited texturing mask layer.

Further, according to the preparation method for the low-cost passivated contact full-back electrode solar cell, in step S8, the $AlO_x$ film is simultaneously deposited on the front and back of the Si wafer by a tubular or platelike atomic layer deposition (ALD) device configured for double-sided deposition, where the $AlO_x$ film has a thickness of 2 nm-20 nm.

Further, according to the preparation method for the low-cost passivated contact full-back electrode solar cell, in step S9, the $SiN_x$ passivation film or the $SiN_x/SiON_x$ laminated passivation film is deposited on the front and back of the Si wafer by a tubular or platelike PECVD device, respectively, where the passivation film has a thickness of 50 nm-100 nm and a refractive index of 1.9-2.4.

Further, according to the preparation method for the low-cost passivated contact full-back electrode solar cell, in step S11, the sintering temperature is controlled at 700° C.-900° C.

A low-cost passivated contact full-back electrode solar cell is prepared by the above preparation method. The prepared full-back electrode solar cell includes a P-type monocrystalline Si wafer, and a front passivation film layer located on the front of the P-type monocrystalline Si wafer, as well as a polycrystalline Si film layer, an Al-back surface field (BSF) layer and a back passivation film layer that are located on the back of the P-type monocrystalline Si wafer, a first electrode located under the polycrystalline Si film layer, and a second electrode located under the Al—BSF layer.

Specifically, the preparation method of the low-cost passivated contact full-back electrode solar cell described in the present invention includes the following specific steps:

S1: configuring the P-type monocrystalline Si wafer as a Si substrate and performing an alkali polishing on the Si substrate. Specifically, the liquid used for the alkali polishing is 15 wt %-30 wt % KOH solution, and the process temperature is 75° C.-85° C.

S2: after performing the alkali polishing, performing an RCA cleaning and an HF cleaning for high cleanliness.

S3: growing a tunnel $SiO_x$ film layer, an in-situ doped amorphous Si film layer (TOPCon layer), and a texturing mask layer on the back of the Si wafer to form a three-in-one multi-layer film. Specifically, the TOPCon layer is produced in the in-situ doping deposition process of phosphine, silane, and hydrogen. The texturing mask layer is flexibly selected from $SiO_x$, $SiON_x$, $SiN_x$, or other films according to the subsequent process. The texturing mask layer is configured to resist the corrosion of KOH or TMAH solution during the subsequent double-sided texturing process.

S4: then performing an annealing activation on the amorphous Si film to activate the in-situ doped phosphorus atoms, so that the amorphous Si film layer deposited by PECVD is simultaneously transformed into a polycrystalline Si film layer. In addition, during the high-temperature process, the hydrogen atoms in the film layer are diffused to the $SiO_2/Si$ interface to saturate the surface dangling bonds and increase the passivation effect. This step is performed using a tubular oxidation furnace, and the process temperature is 700° C.-900° C.

S5: etching the texturing mask layer on the back of the Si wafer by a laser. Slots are created by the laser on a certain area (BSF area) on the back of the Si wafer of the cell, and a part of the texturing mask layer deposited in step S3 is ablated.

S6: subsequently, performing a double-sided texturing on the Si wafer. The polycrystalline Si film layer deposited in step S3 is protected by the texturing mask layer to form a textured structure having a front pyramid and a back BSF pyramid. Before texturing, the Si wafer needs to be pre-cleaned using HF to remove the oxide layer formed on the front of the Si wafer and reduce the impact on the uniformity of texturing.

S7: after performing the texturing, performing the HF cleaning to completely remove the residual texturing mask layer on the back of the Si wafer.

S8: simultaneously depositing an $AlO_x$ film on the front and back of the Si wafer by a tubular or platelike ALD device configured for double-sided deposition. Negatively charged $AlO_x$ forms a good field passivation effect on the P-type Si without affecting the TOPCon layer.

S9: depositing a $SiN_x$ passivation film or a $SiN_x/SiON_x$ laminated passivation film on the front and back of the Si wafer.

S10: ablating, by the laser, a part of the $AlO_x$ film and a part of the $SiN_x$ passivation film or the $SiN_x/SiON_x$ laminated passivation film on the back of the Si wafer. That is, the slotting process is performed by the laser on a certain area (BSF area) on the back of the Si wafer of the cell to ablate a part of the $AlO_x/SiN_x/SiON_x$ film layer deposited in step S9 so that the Al paste electrode and the Si surface are in direct contact, and the Al—BSF layer is formed in the sintering process.

S11: performing a screen-printing and a sintering on the back of the Si wafer, where a silver paste is used in a passivated contact area, and an aluminum paste is used in a backfield area. Specifically, an Ag electrode and an Al electrode are screen-printed in the TOPCon area and the BSF area, respectively, and the final sintering process is performed using a conventional sintering furnace of the PERC production line. The sintering temperature is controlled at 700° C.-900° C.

Advantages of the Present Invention (1) The preparation method for the low-cost passivated contact full-back electrode solar cell designed by the present invention can produce solar cells with better cost performance and higher efficiency through less upgrading on the prior PERC production line. The P-type full-back electrode solar cell of the present invention has the advantages of good process compatibility, high photoelectric conversion efficiency, and low preparation cost, which is of great significance to promote the large-scale production of low-cost and high-performance solar cells.

(2) The preparation method for the low-cost passivated contact full-back electrode solar cell provided by the present invention uses the PECVD configured for single-sided deposition to deposit the tunnel oxide layer, the polycrystalline Si film layer, and the texturing mask layer. In addition, the preparation method can reduce the cost per watt and improve efficiency by using the selective emitter (SE) laser, laser slotting, diffusion oxidation, and printing and sintering device in the prior PERC production line while retaining the prior PERC device to the maximum extent.

(3) The preparation method for the low-cost passivated contact full-back electrode solar cell provided by the present invention makes full use of the characteristics of the single-sided coating and flexible growth of multiple types of films in a single cavity in PECVD. The passivated contact structural film layer and the mask film layer of the full-back electrode cell are completed in one process step, which can effectively reduce the process steps, reduce the consumption of silver paste, and improve cell efficiency.

(4) The process of three-in-one multi-layer film deposition on the back of the Si wafer designed by the present invention is a one-step method, which has more advantages. In the prior art, the deposition of the tunnel $SiO_x$ film, the intrinsic polycrystalline Si film, and the $SiN_x$ film needs to be completed in different devices so that the cell needs more automatic actions such as loading and unloading during the preparation process, which greatly affects the preparation yield. In addition, the prior process is completed step by step, and the cell needs more thermal and heating/cooling processes, which also affects cell efficiency. The present invention adopts the three-in-one multi-layer film deposition process, namely the one-step method, which can overcome these problems of the prior process.

BRIEF DESCRIPTION OF THE DRAWINGS

To describe the technical solutions in the embodiments of the present invention more clearly, the accompanying drawings required for describing the embodiments are briefly described below. Obviously, the accompanying drawings in the following description show merely some embodiments of the present invention, and a person of ordinary skill in the art would also be able to derive other drawings from these accompanying drawings without creative efforts.

The FIGURE a schematic diagram showing the structure of a low-cost passivated contact full-back electrode solar cell prepared by the present invention.

Reference numerals: 1. front passivation film layer; 2. P-type monocrystalline Si wafer; 3. polycrystalline Si film layer; 4. Al—BSF layer; 5 . . . back passivation film layer; 6 . . . first electrode; and 7. second electrode.

DETAILED DESCRIPTION OF THE EMBODIMENTS

The following clearly and completely describes the technical solutions in the embodiments of the present invention by referring to the accompanying drawings. It will be apparent that the described embodiments are merely a part, rather than all, of the embodiments of the present invention. The following description of at least one exemplary embodiment is merely illustrative and not intended to limit the present invention and application or use thereof in any way. All other embodiments obtained by a person of ordinary skill in the art based on the embodiments of the present invention without creative efforts shall fall within the protection scope of the present invention.

Embodiment 1

S1: A P-type monocrystalline Si wafer is configured as a Si substrate, where the Si wafer has a resistivity of 0.5 ohm-cm to 5 ohm-cm and a thickness of 120 μm-200 μm. Alkali polishing is then performed on the Si substrate using a 15 wt %-30 wt % KOH solution at 75° C.-85° C.

S2: After performing the alkali polishing, RCA cleaning and HF cleaning for high cleanliness are performed.

S3: A single-sided deposition is performed by a tubular or platelike PECVD device, that is, three-in-one multi-layer film deposition is performed on the back of the P-type monocrystalline Si wafer to grow a tunnel $SiO_x$ film layer, an in-situ doped amorphous Si film layer (TOPCon layer), and a texturing mask layer. The thickness of the tunnel $SiO_x$ film layer is less than 2 nm. The amorphous Si film layer is an in-situ phosphorus-doped film with a thickness of 50 nm-200 nm. The texturing mask layer is made of $SiN_x$ with a thickness of 50 nm-100 nm. Specifically, the TOPCon layer is produced by the in-situ doping deposition process of phosphine, silane, and hydrogen, and the texturing mask layer is configured to resist the corrosion of KOH or TMAH solution during the subsequent double-sided texturing process.

S4: An annealing activation is performed on the amorphous Si film mentioned above by a tubular oxidation furnace to activate the in-situ doped phosphorus atoms. Simultaneously, the amorphous Si film layer deposited by PECVD is transformed into a polycrystalline Si film layer with a sheet resistance controlled at 50 ohm/sq-100 ohm/sq. In addition, during the high-temperature process, the hydrogen atoms in the film layer are diffused to the $SiO_2$/Si interface to saturate the surface dangling bonds and increase the passivation effect. The process temperature of the annealing activation of this step is 700° C.-900° C., the time for the annealing activation is 1 h-2 h, and the doping concentration after activation is $1e^{18}$ cm$^{-3}$-$5e^{20}$ cm$^{-3}$.

S5: The texturing mask layer on the back of the Si wafer is etched by laser. Slots are created by the laser on a certain area (BSF area) on the back of the Si wafer of the cell, and a part of the texturing mask layer deposited in step S3 is ablated.

S6: Subsequently, a double-sided texturing is performed on the P-type monocrystalline Si wafer using the KOH or TMAH solution (the polycrystalline Si film layer deposited in step S3 is protected by the texturing mask layer) to form a textured structure having a front pyramid and a back BSF pyramid. Before texturing, the Si wafer needs to be pre-cleaned using HF to remove the oxide layer formed on the front of the Si wafer and reduce the impact on the uniformity of texturing.

S7: After performing the texturing, cleaning is performed by a 5 wt %-20 wt % HF solution to completely remove the residual texturing mask layer on the back of the Si wafer.

S8: An AlO$_x$ film with a thickness of 2 nm-20 nm is simultaneously deposited on the front and back of the Si wafer by a tubular or platelike ALD device configured for double-sided deposition. Negatively charged AlO$_x$ forms a good field passivation effect on the P-type Si without affecting the TOPCon layer.

S9: A SiN$_x$ passivation film or a SiN$_x$/SiON$_x$ laminated passivation film are deposited on the front and back of the Si wafer by a tubular or platelike PECVD device, respectively, where the passivation film has a thickness of 50 nm-100 nm and a refractive index of 1.9-2.4.

S10: A part of the AlO$_x$ film and a part of the SiN$_x$ passivation film or the SiN$_x$/SiON$_x$ laminated passivation film on the back of the Si wafer are ablated by the laser. That is, the slotting process is performed by the laser on a certain area (BSF area) on the back of the Si wafer of the cell to ablate a part of the AlO$_x$/SiN$_x$/SiON$_x$ film layer deposited in step S9 so that the Al paste electrode and the Si surface are in direct contact, and the Al—BSF layer is formed in the sintering process.

S11: An Ag electrode and an Al electrode are screen-printed in the TOPCon area and the BSF area, respectively, and the final sintering process is performed using a conventional sintering furnace of the PERC production line. The sintering temperature is controlled at 700° C.-900° C. The P-type full-back electrode solar cell is completely prepared.

As shown in the FIGURE, the low-cost P-type Si wafer passivated contact full-back electrode crystalline Si solar cell prepared by the present invention includes the P-type monocrystalline Si wafer 2, and the front passivation film layer 1 located on the front of the P-type monocrystalline Si wafer 2, as well as the polycrystalline Si film layer 3, the Al—BSF layer 4 and the back passivation film layer 5 that are located on the back of the P-type monocrystalline Si wafer 2, the first electrode 6 located under the polycrystalline Si film layer 3, and the second electrode 7 located under the Al—BSF layer 4.

The design solution of the present invention can produce solar cells with better cost performance and higher efficiency through less upgrading on the prior PERC production line. The P-type full-back electrode solar cell prepared by the present invention has the advantages of good process compatibility, high photoelectric conversion efficiency, and low preparation cost, which is of great significance to promote the large-scale production of low-cost and high-performance solar cells.

The preferred embodiments of the present invention are merely intended to explain the present invention rather than to limit the present invention. Any obvious changes or modifications made to the technical solution of the present invention should fall within the protection scope of the present invention.

What is claimed is:

1. A preparation method for a passivated contact full-back electrode solar cell, comprising following sequential steps:
   S1: configuring a P-type monocrystalline silicon (Si) wafer as a Si substrate and performing an alkali polishing on the Si substrate;
   S2: after performing the alkali polishing, performing a Radio Cooperation of America (RCA) cleaning and a hydrogen fluoride (HF) cleaning;
   S3: growing a tunnel silicon oxide (SiO$_x$) film layer, an in-situ doped amorphous Si film layer, and a texturing mask layer on a back of the P-type monocrystalline Si wafer;
   S4: performing an annealing activation on the in-situ doped amorphous Si film layer, so that the in-situ doped amorphous Si film layer is transformed into a polycrystalline Si film layer;
   S5: etching the texturing mask layer on the back of the P-type monocrystalline Si wafer by a laser;
   S6: performing a double-sided texturing on the P-type monocrystalline Si wafer;
   S7: after performing the double-sided texturing, performing the HF cleaning to completely remove the texturing mask layer;
   S8: simultaneously depositing an aluminum oxide (AlO$_x$) film on a front and the back of the P-type monocrystalline Si wafer;
   S9: depositing a silicon nitride (SiN$_x$) passivation film or a silicon nitride/silicon oxynitride (SiN$_x$/SiON$_x$ laminated passivation film on the front and the back of the P-type monocrystalline Si wafer;
   S10: ablating, by the laser, a part of the AlO$_x$ film and a part of the SiN$_x$ passivation film or the SiN$_x$/SiON$_x$ laminated passivation film on the back of the P-type monocrystalline Si wafer; and
   S11: performing a screen-printing and a sintering on the back of the P-type monocrystalline Si wafer, wherein a silver paste is used in a passivated contact area, and an aluminum paste is used in a backfield area.

2. The preparation method according to claim 1, wherein in step S1, the P-type monocrystalline Si wafer is configured as the Si substrate, wherein the P-type monocrystalline Si wafer has a resistivity of 0.5 ohm-cm to 5 ohm-cm and a thickness of 120 μm-200 μm; and the alkali polishing is performed on the Si substrate by a 15 wt %-30 wt % potassium hydroxide (KOH) solution at 75° C.-85° C.

3. The preparation method according to claim 1, wherein in step S3, a tubular or platelike plasma-enhanced chemical vapor deposition (PECVD) device configured for single-sided deposition is configured to perform a three-in-one multi-layer film deposition on the back of the P-type monocrystalline Si wafer to grow the tunnel SiO$_x$ film layer, the in-situ doped amorphous Si film layer, and the texturing mask layer; wherein a thickness of the tunnel SiO$_x$ film layer is less than 2 nm, the in-situ doped amorphous Si film layer is an in-situ phosphorus-doped film with a thickness of 50 nm-200 nm, and the texturing mask layer is made of SiONx, SiOx, or SiNx with a thickness of 50 nm-100 nm.

4. The preparation method according to claim 1, wherein in step S4, the annealing activation is performed on the in-situ doped amorphous Si film layer, so that the in-situ doped amorphous Si film layer is transformed into the polycrystalline Si film layer with a sheet resistance controlled at 50 ohm/sq-100 ohm/sq; wherein the annealing activation is performed by a tubular oxidation furnace; a process temperature is 700° C.-900° C., a time for the annealing activation is 1 h-2 h, and a doping concentration after activation is $1e^{18}$ $cm^{-3}$-$5e^{20}$ $cm^{-3}$.

5. The preparation method according to claim 1, wherein in step S6, the double-sided texturing is performed on the P-type monocrystalline Si wafer using a KOH or tetramethylammonium hydroxide (TMAH) solution to form a light-trapping textured structure.

6. The preparation method according to claim 1, wherein in step S7, after performing the double-sided texturing, cleaning is performed by a 5 wt %-20 wt % HF solution to completely remove the texturing mask layer.

7. The preparation method according to claim 1, wherein in step S8, the $AlO_x$ film is simultaneously deposited on the front and the back of the P-type monocrystalline Si wafer by a tubular or platelike atomic layer deposition (ALD) device configured for double-sided deposition, wherein the $AlO_x$ film has a thickness of 2 nm-20 nm.

8. The preparation method according to claim 1, wherein in step S9, the $SiN_x$ passivation film or the $SiN_x/SiON_x$ laminated passivation film is deposited on the front and the back of the P-type monocrystalline Si wafer by a tubular or platelike PECVD device, respectively, wherein the $SiN_x$ passivation film or the $SiN_x/SiON_x$ laminated passivation film has a thickness of 50 nm-100 nm and a refractive index of 1.9-2.4.

9. The preparation method according to claim 1, wherein in step S11, a sintering temperature is controlled at 700° C.-900° C.

* * * * *